United States Patent
Bainbridge

(10) Patent No.: US 7,991,031 B2
(45) Date of Patent: Aug. 2, 2011

(54) INJECTION SEEDED LASER RATIO LOOP CONTROL

(75) Inventor: John D. Bainbridge, Ottawa (CA)

(73) Assignee: LG-Ericsson Co., Ltd., Seoul (KR)

( * ) Notice: Subject to any disclaimer, the term of this patent is extended or adjusted under 35 U.S.C. 154(b) by 0 days.

(21) Appl. No.: 12/545,103

(22) Filed: Aug. 21, 2009

(65) Prior Publication Data

US 2011/0044366 A1 Feb. 24, 2011

(51) Int. Cl.
  *H01S 3/00* (2006.01)
(52) U.S. Cl. ............ 372/38.02; 372/38.1; 372/38.01; 372/38.07
(58) Field of Classification Search ............ 372/38.1, 372/38.02, 38.01, 38.07
  See application file for complete search history.

(56) References Cited

U.S. PATENT DOCUMENTS

| | | | |
|---|---|---|---|
| 6,928,094 B2* | 8/2005 | Asuri et al. | 372/38.02 |
| 7,850,083 B2* | 12/2010 | Sanchez-Olea et al. | 235/454 |
| 2004/0212390 A1* | 10/2004 | Harker | 324/765 |
| 2005/0078721 A1* | 4/2005 | Wu et al. | 372/38.01 |
| 2005/0084202 A1* | 4/2005 | Smith et al. | 385/14 |
| 2006/0153256 A1* | 7/2006 | Sanchez | 372/34 |
| 2009/0274471 A1* | 11/2009 | Bowler et al. | 398/197 |

* cited by examiner

*Primary Examiner* — Minsun Harvey
*Assistant Examiner* — Phillip Nguyen
(74) *Attorney, Agent, or Firm* — KED & Associates, LLP

(57) ABSTRACT

In a method of controlling an injection-seeded laser, a response of the laser is sampled at a plurality of different laser current values. A threshold current and a slope efficiency of the sampled response are then estimated, and a bias current and a modulation current calculated based on the estimated threshold current and a slope efficiency.

20 Claims, 4 Drawing Sheets

US 7,991,031 B2

INJECTION SEEDED LASER RATIO LOOP CONTROL

CROSS-REFERENCE TO RELATED APPLICATIONS

This is the first application filed in respect of the present invention

FIELD OF THE INVENTION

The present application relates generally to controlling injection seeded lasers and, more specifically, to laser ratio loop control of an injection seeded laser.

BACKGROUND OF THE INVENTION

In the field of optical communications, it is well known to use semi-conductor laser diodes to generate a narrowband optical signal onto which data is modulated for transmission through an optical medium such as an optical fiber link. In order to obtain desired characteristics of the optical signal (such as center wavelength, line width, signal reach, for example) the output power of the laser diode must be maintained within narrow tolerances. Because different laser diodes have different output power characteristics in response to a given driving current, it is desirable to monitor the output power from each laser diode, and adjust the driving current as needed to maintain the output power at a desired level. FIG. 1 schematically illustrates a typical laser control system 2 for this purpose.

In the laser control system 2 of FIG. 1, a typical Transmission Optical Sub-Assembly (TOSA) 4 comprises a semiconductor laser diode 6 and a Back facet Monitoring (BFM) photodetector 8 mounted on a substrate 10 such as a printed circuit (PC) board. A controller unit 12 supplies a bias current $I_{BIAS}$ 14 and a modulation current $I_{MOD}$ 16 to the laser diode 6 to generate an output optical signal 18 for transmission. In order to control the laser diode, the controller unit 12 receives a back facet monitoring (BFM) current $I_{BFM}$ 20 from the photodetector 8, and a temperature indication ($T_{PCB}$) 22 from a sensor (not shown) mounted on the substrate proximal the laser diode 6. Ideally, the temperature sensor would measure the temperature of the laser diode 6 itself. However, since this is often impractical for various reasons, the temperature sensor is typically mounted to detect the temperature of the substrate (or printed circuit board) near the laser diode 6. Since the thermal properties of the substrate are known, or at least known to be approximately constant within the operating temperature range of the laser diode 6, then the substrate temperature ($T_{PCB}$) can be used as a proxy for the actual laser temperature.

Typically, the controller 12 is coupled to a memory 24, which includes a non-volatile memory 26.

In normal operation, the controller 12 adjusts the bias current $I_{BIAS}$ 14 so as to maintain the BFM current $I_{BFM}$ 20 at a predetermined value. In some cases, the controller 12 may also adjust the modulation limits of modulation current $I_{MOD}$ 16 to maintain a desired extinction ratio. In TOSAs in which the laser diode 6 is a bulk semiconductor laser diode, this operation allows accurate control of the power level of the output optical signal 18. However, this operation generally will not work for injection seeded lasers, such as an injection seeded Fabry-Perot laser. As may be seen in FIG. 1, in the case of an injection seeded laser, a seed light 28 is provided to the TOSA 4, and injected into the cavity (not shown) of the laser 6. In this case, the BFM current $I_{BFM}$ 20 will contain a component proportional to the injection power of the seed light 28. This raises a difficulty in that the injection power level of the seed light 28 is unknown, and may change rapidly with time. Under these conditions, the BFM current $I_{BFM}$ 20 does not provide a accurate indication of the power level of the optical signal 18, and thus the conventional method of controlling the output power based on the BFM current $I_{BFM}$ 20 cannot be used.

In order to address this problem, injection seeded lasers are typically controlled using the temperature $T_{PCB}$ 22. In this case, the laser control function is based on the assumption that the power level of the output optical signal 18 is proportional to the laser temperature. However, in fact, the correlation between temperature and output power is poor, and can change with changing operating conditions (e.g. seed injection power) and laser aging. As a result, temperature-based control methods tend to be significantly less accurate than methods based on the BFM current 20.

Techniques that overcome the above-noted limitations in the prior art remain highly desirable.

SUMMARY OF THE INVENTION

An aspect of the present invention provides a method of controlling an injection-seeded laser. A response of the laser is sampled at a plurality of different laser current values. A threshold current and a slope efficiency of the sampled response are then estimated, and a bias current and a modulation current calculated based on the estimated threshold current and a slope efficiency.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF PREFERRED EMBODIMENTS

The present invention provides techniques for controlling an injection seeded laser using Back Facet Monitoring (BFM) current. A representative embodiment is described below with reference to FIGS. 2-5.

Figure 1:
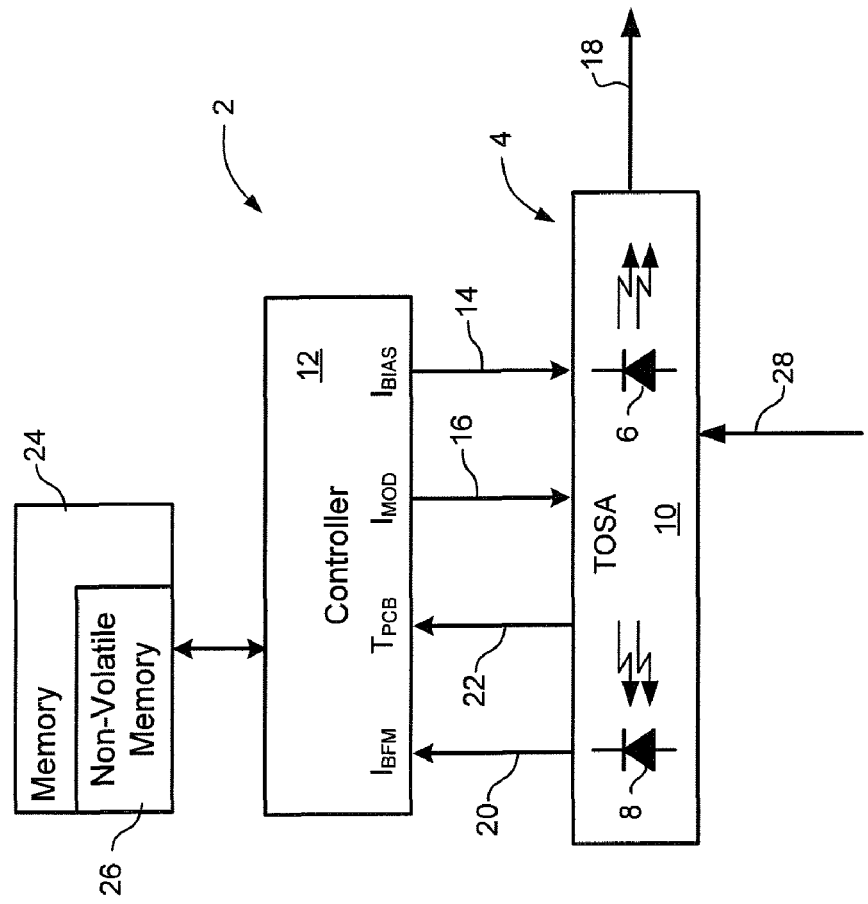
FIG. 1 schematically illustrates a conventional laser control system known in the prior art.

In very general terms, present invention provides techniques for controlling an injection seeded laser, by iteratively estimating the laser threshold current and the slope efficiency during run-time. These estimates provide a simple model of the laser response, which can then be used to set the laser bias and modulation currents. Advantageously, techniques in accordance with the present invention can be implemented in a conventional laser control system of the type described above with reference to FIG. 1. In such cases, practical implementations may take the form of a software of firmware load that can be stored in the non-volatile memory 26, for example, for execution in a processor (not shown) of the controller 12.

Figure 2A:
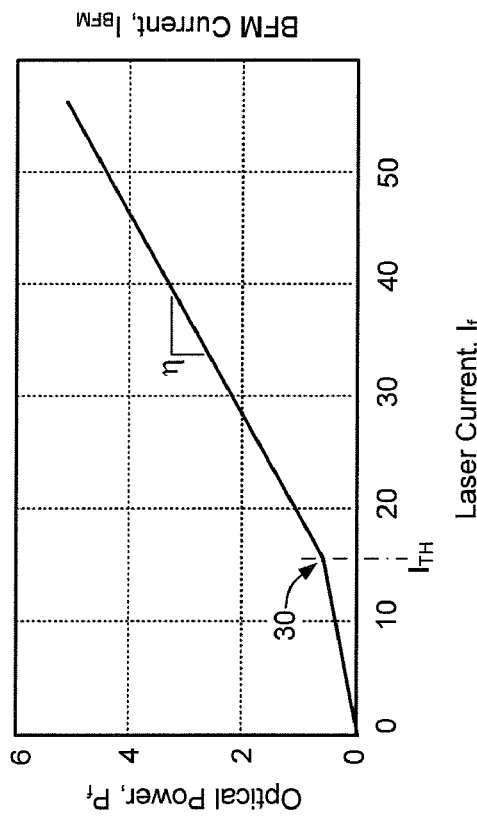
FIGS. 2a and 2b are charts showing a BFM response of an injection seeded laser.
Figure 2B:
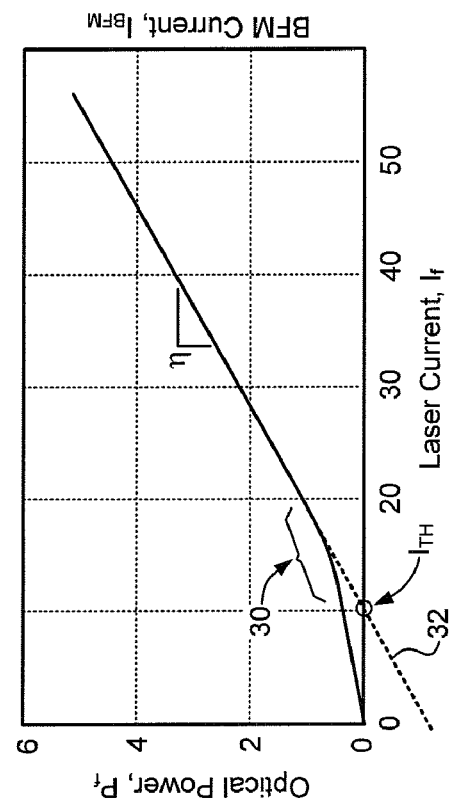

FIGS. 2a and 2b are charts illustrating the response of an injection seeded laser, in terms of the optical power $P_f$ of the output signal 18 (FIG. 1) as a function of the total laser current $I_f$ ($=I_{BIAS}+I_{MOD}$). As may be seen in FIG. 2a, the laser response is piece-wise linear, ideally with a sharp corner 30 located at a threshold laser current $I_{TH}$. The slope of the linear laser response above the threshold laser current $I_{TH}$ is referred to as the slope efficiency of the laser. In cases where the laser response exhibits a sharp corner 30, the threshold laser current $I_{TH}$ can easily be found by computing the second derivative of the response curve. As may be appreciated, the first derivative of the laser response will exhibit a step change at the at the threshold laser current $I_{TH}$, and this step change will appear as a distinct peak in the second derivative. Accordingly, the threshold laser current $I_{TH}$ can be obtained by finding the leak value of the second derivative of the laser response.

In reality, both the sharpness of the corner, and the threshold laser current $I_{TH}$ are a function of the laser temperature and the seed injection power. Accordingly, in any practical communications network, for example, both of these characteristics will be time varying. In general, increasing injection power or reducing temperature will tend to increase the sharpness of the corner. In many cases, therefore, the actual laser response will exhibit a soft corner 30, as may be seen in FIG. 2b, in which case the second derivative of this response may not exhibit a distinct peak. In the absence of a distinct peak, the second derivative may not yield a reliable estimate of the threshold laser current $I_{TH}$. This problem may be overcome by fitting a line 32 to the laser response above the (soft) corner 30, and then estimating the laser threshold current $I_{TH}$ as the point at which the fitted line 32 intersects the laser current axis (which corresponds with zero BFM current), as may be seen in FIG. 2b.

Various methods may be used to fit a line to the laser response. In some embodiments, the approximate location of the corner 30 is determined using a maxima of the second derivative. The line can then be fitted to the portion of the laser response lying a predetermined distance above this location. For example, the maxima of the second derivative may be found at a laser current $I_f$ denoted as Ith-SD, and the line fitted to the portion of the laser response at laser current values of $I_f \geq 1.1*$Ith-SD. Extrapolating the line to the laser current axis ($I_{BFM}=0$) yields an estimate of the threshold current $I_{TH}$, and the slope of the fitted line can be used as the slope efficiency. If desired, this technique may be used as a general method for computing the threshold current $I_{TH}$ and slope efficiency of a given laser, using raw laser response data comprising sampled BFM current values for a set of laser current values. If desired, the first and second derivatives of the raw laser response can be smoothed (for example using an 8-point filter) to reduce errors due to noise in the raw laser response data.

Figure 5:
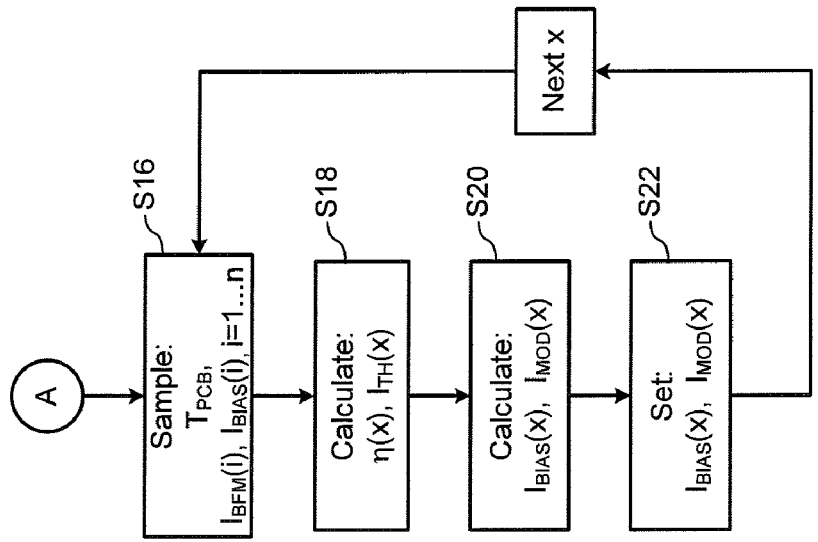
FIG. 5 is a flow chart showing a method of controlling an injection seeded laser during steady-state operation, in accordance with a representative embodiment of the present invention.
Figure 4:
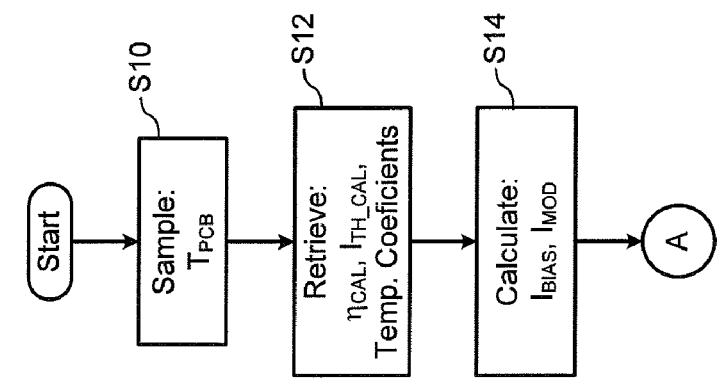
FIG. 4 is a flow chart showing a method of initializing an injection seeded laser in accordance with a representative embodiment of the present invention.
Figure 3:
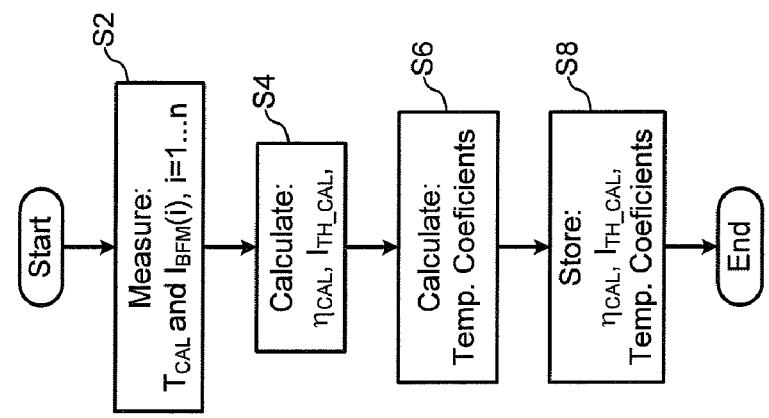
FIG. 3 is a flow chart showing a method of calibrating an injection seeded laser in accordance with a representative embodiment of the present invention.

FIGS. 3-5 are flowcharts illustrating a representative method of dynamically controlling an injection seeded laser in accordance with the present invention.

FIG. 3 is a flowchart showing an initial calibration of a laser, which may be performed during product testing at the time of manufacture, in order to obtain initial values of threshold current $I_{TH}$ and slope efficiency $\eta$, which may be denoted as $I_{TH\_CAL}$ and $\eta_{CAL}$, respectively. At an initial step (at S2), the temperature $T_{PCB}$ 22 is sampled and saved as the calibration temperature $T_{CAL}$. The laser response at the calibration temperature $T_{CAL}$ is measured by sampling the BFM current $I_{BFM}(i)$ at each one of a set of laser current $I_f(i)$ values (where i is an index). The laser response data (comprising the set of the set of $I_f(i)$, $I_{BFM}(i)$ value pairs) can then be processed (at S4), for example as described above with reference to FIG. 2b, to obtain respective calibration values of the threshold current $I_{TH\_CAL}$ and slope efficiency $\eta_{CAL}$. In addition, a laser threshold current temperature coefficient $$\frac{\partial I_{TH}}{\partial T},$$

and a BFM slope efficiency temperature coefficient $$\frac{\partial \eta}{\partial T}$$

can also be calculated (at S6). The computed values of $I_{TH\_CAL}$ $\eta_{CAL}$, $$\frac{\partial I_{TH}}{\partial T}, \text{ and } \frac{\partial \eta}{\partial T}$$

are then stored in a non-volatile memory of the control unit 12 for use during run-time of the laser (at S8).

FIG. 4, is a flowchart illustrating a method of initializing the injection seeded laser based on the calibration values obtained and stored as described above with reference to FIG. 3. Upon start-up of the laser (for example, following application of power to the Transmission Optical Sub-Assembly (TOSA) 4), the temperature $T_{PCB}$ 22 is sampled (at S10), and the calibration data $$\left(I_{TH\_CAL}\eta_{CAL}, \frac{\partial I_{TH}}{\partial T}, \text{ and } \frac{\partial \eta}{\partial T}\right)$$

retrieved from the non-volatile memory (at S12). Based on this information, initial values of the bias current $I_{BIAS}$ and modulation current $I_{MOD}$ are calculated (at S14).

For example, based on the calibration data $$\left(I_{TH\_CAL}\eta_{CAL}, \frac{\partial I_{TH}}{\partial T}, \text{ and } \frac{\partial \eta}{\partial T}\right)$$

and the measured temperature $T_{PCB}$, an estimate of the threshold current $I_{TH}(T_{PCB})$ can be calculated as:

$$I_{TH}(T_{PCB}) = I_{TH\_CAL} + \frac{\partial I_{TH}}{\partial T}(T_{PCB} - T_{CAL})$$

and an estimate of the slope efficiency $\eta(T_{PCB})$ can be calculated as:

$$\eta(T_{PCB}) = \eta_{CAL} + \frac{\partial \eta}{\partial T}(T_{PCB} - T_{CAL})$$

The initial value of bias current $I_{BIAS}$ can then be calculated as $I_{BIAS}=TMF*I_{TH}(T_{PCB})$, where TMF is a predetermined multiplying factor.

In some embodiments, TMF is a composite of a static value and a linear function of the slope efficiency $\eta$. Coupling the DC bias to the slope efficiency provides the control loop with a way of adapting to the environmental conditions of injection power, wavelength and temperature, all of which affect the slope efficiency $\eta$.

The form of TMF will determine how well the useful power from the laser can be equalized. The conditions under which the laser is expected to operate and the basic capability of the device itself, especially at high temperatures, means that there will always be a relatively large range in power. However, by having a variable TMF, it is possible to boost the power at low slope efficiencies while reducing it at high slope efficiencies.

Figure 6:
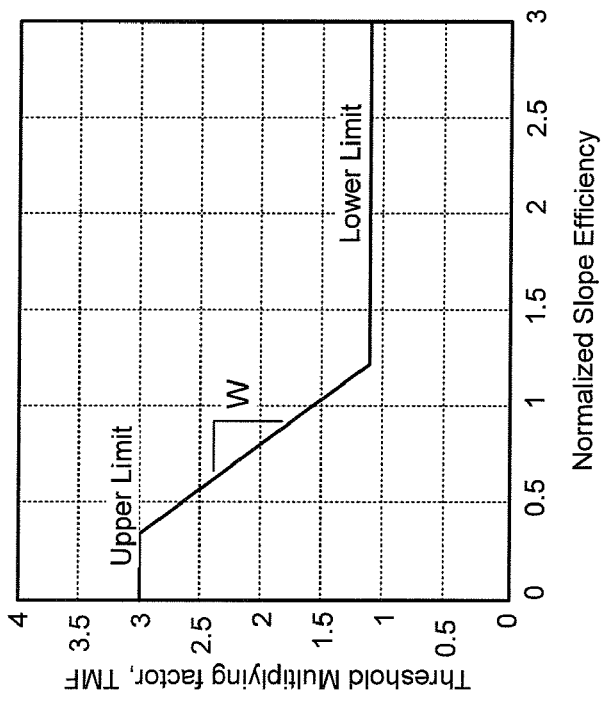
FIG. 6 is a chart illustrating a representative TMF function usable for computing bias current, in accordance with a representative embodiment of the present invention.

Preferably, TMF is a linear function of the form $$TMF = TMF_{static} + W\left(1 - \frac{\eta(T_{PCB})}{\eta_{CAL}}\right),$$

with upper and lower limits imposed on it. In this form of TMF, $TMF_{static}$ is a normalized ratio relative to the threshold current (having value of, for example, 1.4), and W is a weighting factor. Other suitable values of $TMF_{static}$ may be used, if desired. The lower limit should always be greater than 1. This stems from the definition of the threshold current being at the point of zero power. The upper limit is arbitrary and may be set based on the available range of the DC bias and the expected maximum threshold current. This limited linear function is shown in FIG. 6. Features to note in FIG. 6 are the upper and lower limits and the slope of the linear portion, which is equal to the weighting factor, W. In the example of FIG. 6, the units of the defining equation are normalized, in which case W is a value of order 1.

The linear TMF function described above is preferred because it is simple. However other TMF functions may equally be used, if desired, including piecewise linear, polynomial or exponential functions.

The BFM current at the bias point can then be estimated as: $I_{BFM\ 0}=[I_{BIAS}-I_{TH}(T_{PCB})]*\eta(T_{PCB})$ and the expected mean BFM current for a desired modulation depth (MD), can be calculated as $$\overline{I_{BFM}} = \frac{1}{2}I_{BFM0}*(MD+1).$$

Figure 7:
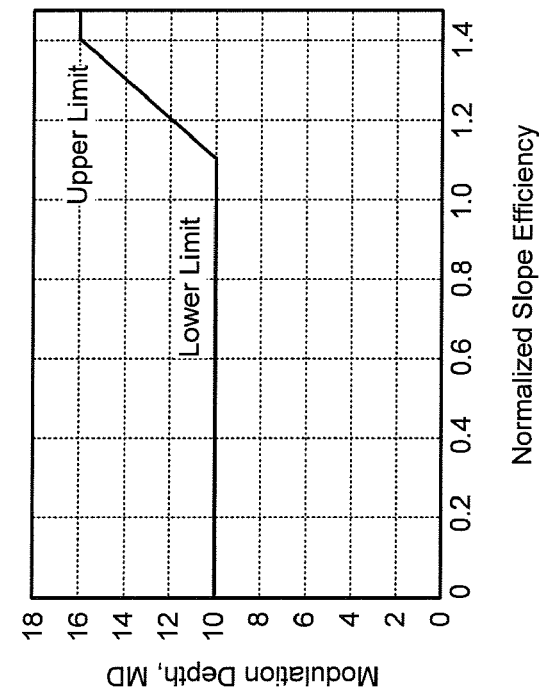
FIG. 7 is a chart illustrating a representative Modulation Depth function usable for computing modulation current, in accordance with a representative embodiment of the present invention.

Preferably, the modulation depth MD is varied in response to changes in slope efficiency. If desired, this can be done using a function of the same general form as described above for TMF, but with appropriate different values of the upper and lower limits, and the constants. An example of such linear function of MD is shown in FIG. 7. In this chart, MD is held at a lower limit (of 10) for low values of the normalized slope efficiency, and is increased (to an upper limit of 16) at higher normalized slopes to an upper limit and then capped. Other suitable upper and lower limit values may be used, if desired. Defining the modulation depth MD in this manner addresses a problem seen at high injection power levels. At high injection power, the BFM slope efficiency increases, which, for a fixed modulation depth can result in a low modulation current being applied to the laser. Although this may still meet the Extinction Ratio requirements, it can be low in average power. By increasing the modulation depth at high slopes, more modulation current is forced into the laser, thus raising the average power. Extinction ratio is improved so this will not incur any extra errors in the data traffic.

As in the case of TMF, the form of the mask shown in FIG. 7 is chosen because it is simple to implement. However, other MD functions may equally be used, if desired, including piecewise linear, polynomial or exponential functions.

The expected modulation current $I_{MOD}$ for the desired modulation depth (MD) can then be calculated as:

$$I_{MOD} = \frac{I_{BFM0}*(MD-1)}{\eta(T_{PCB})}.$$

The initial values of the bias current $I_{BIAS}$ and modulation current $I_{MOD}$ calculated above can then be used by the laser controller 12 for initial control the laser 6. Once the laser has started operation, the controller 12 can then switch to a run-time control loop, which is described below with reference to FIG. 5.

As may be seen in FIG. 5, the run-time control loop is preferably an iterative process which updates the values of the bias current $I_{BIAS}$ and modulation current $I_{MOD}$ at predetermined intervals so as to adaptively track (and compensate) changes in the laser response due to environmental factors particularly temperature and injection power. Thus, during each iteration, laser response data comprising the temperature $T_{PCB}$ and a set of corresponding laser current $I_f(=I_{BIAS}+I_{MOD})$ and BFM current $I_{BFM}$ values are sampled (at S16) and stored in memory 24 of the controller 12. The accumulation of run-time $(I_f, I_{BFM})$ value pairs in this manner is advantageous, because it enables valid laser response data to be obtained without interfering with the transmission of customer data. In some embodiments, the set of $(I_f, I_{BFM})$ value pairs comprises a predetermined number of value pairs. In other embodiments, $(I_f, I_{BFM})$ value pairs may be accumulated until the set of $(I_f, I_{BFM})$ value pairs encompasses a predetermined range of laser current $I_f$ values. In some embodiments, the set of accumulated $(I_f, I_{BFM})$ value pairs may be processed to eliminate value pairs with duplicate laser current $I_f$ values. The $(I_f, I_{BFM})$ value pairs can be obtained by a deterministic periodic dither of $I_{BIAS}$ or $I_{MOD}$.

The set of accumulated set of $(I_f, I_{BFM})$ value pairs can then be processed (at S18), for example as described above with reference to FIG. 2b, to obtain updated estimates of the threshold current $I_{TH}(x)$ and slope efficiency $\eta(x)$, where x is an index of the iteration. These values can then be used (at S20) to compute updated values of the bias current $I_{BIAS}(x)$ and modulation current $I_{MOD}(x)$ using techniques closely similar to that described above with reference to FIG. 4. For example, the updated bias current $I_{BIAS}(x)$ can be calculated as $I_{BIAS}(x)=TMF*I_{TH}(x)$. The BFM current at the bias point can then be estimated as: $I_{BFM\ 0}(x)=[I_{BIAS}(x)-I_{TH}(x)]*\eta(x)$ and the expected mean BFM current for the desired modulation depth (MD) can be calculated as $$\overline{I_{BFM}}(x) = \frac{(MD+1)}{2} I_{BFM0}(x).$$

Finally, the updated modulation current $I_{MOD}(x)$ can be calculated as:

$$I_{MOD}(x) = \frac{I_{BFM0}(x) * [MD-1]}{\eta(x)}.$$

The updated bias current $I_{BIAS}(x)$ and modulation current $I_{MOD}(x)$ values can then be used for subsequent operation of the laser 6 (at S22), while a new set of values are calculated in the next iteration (x+1).

In some embodiments, the threshold current $I_{TH}(x)$ and slope efficiency η(x) estimates computed in each iteration are used directly to compute the updated bias current $I_{BIAS}(x)$ and modulation current $I_{MOD}(x)$ values, as described above. In other embodiments, the $I_{TH}(x)$ and η(x) values computed in each iteration are combined with corresponding values computed in one or more previous iterations, and the resulting composite values used to compute the updated bias current $I_{BIAS}(x)$ and modulation current $I_{MOD}(x)$ values. For example, the updated bias current $I_{BIAS}(x)$ and modulation current $I_{MOD}(x)$ values may be computed using respective average values of the threshold current $I_{TH}$ and slope efficiency η computed in the current iteration and a predetermined number of previous iterations. As may be appreciated, averaging the threshold current $I_{TH}$ and slope efficiency η values in this manner has the effect of low-pass filtering these values, and renders the laser control function less sensitive to short-period transients. Naturally, other methods of processing the threshold current $I_{TH}$ and slope efficiency η to compute the updated bias current $I_{BIAS}(x)$ and modulation current $I_{MOD}(x)$ values will become apparent to those of ordinary skill in the art, a and may be used without departing from the intended scope of the present invention.

In the example of FIG. 5, during each iteration, laser response data comprising the temperature $T_{PCB}$ and a set of corresponding laser current $I_f(=I_{BIAS}+I_{MOD})$ and BFM current $I_{BFM}$ values are sampled (at S16) and stored in memory 24 of the controller 12. The set of accumulated set of $(I_f, I_{BFM})$ value pairs are then processed (at S18), as described above with reference to FIG. 2b, to obtain updated estimates of the threshold current $I_{TH}(x)$ and slope efficiency η(x). In an alternative embodiment, updated estimates of the threshold current $I_{TH}(x)$ and slope efficiency η(x) can be derived from the corresponding values computed in the previous iteration. In this case, the laser response data sampled at step S16 of FIG. 5 comprises the temperature $T_{PCB}$, a single laser current $I_f(=I_{BIAS}+I_{MOD})$ and BFM current $I_{BFM}$ value pair. Based on this data, an effective DC laser current $I_{DC\_eff}(x)$ can be calculated as $I_{DC\_eff}(x)=I_{BIAS}+A*I_{MOD}$, where A is a conversion factor between the (time-varying) modulation current and an equivalent DC current. In some embodiments, the conversion factor A is a fixed constant, having value of, for example, 0.5. The updated slope efficiency η(x) can then be determined as $$\eta(x) = \frac{I_{BFM}(x) - I_{BFM}(x-1)}{I_{DC\_eff}(x) - I_{DC\_eff}(x-1)},$$

and the updated threshold current $I_{TH}(x)$ calculated as $$I_{TH}(x) = \frac{C}{\eta(x)},$$

where $C=I_{BFM}(x)-\eta(x)*I_{DC\_eff}(x)$.

The embodiments of the invention described above are intended to be illustrative only. The scope of the invention is therefore intended to be limited solely by the scope of the appended claims.

I claim:
1. A method of controlling an injection-seeded laser, the method comprising:
    sampling a response of the laser at a plurality of different laser current values;
    estimating a threshold current and a slope efficiency of the sampled response; and
    calculating a bias current and a modulation current based on the estimated threshold current and the slope efficiency, wherein the modulation current is calculated based on the estimated slope efficiency of the sampled response, an estimated back facet monitoring current at a bias point of the laser, and a desired modulation depth.
2. The method as claimed in claim 1, wherein sampling the response of the laser comprises sampling a respective back facet monitoring (BFM) current $I_{BFM}$ at each one of the plurality of laser current $I_f$ values.
3. The method as claimed in claim 2, wherein the plurality of laser current $I_f$ values are predetermined.
4. The method as claimed in claim 3, wherein sampling the back facet monitoring (BFM) current $I_{BFM}$ comprises, for each one of the plurality of laser current $I_f$ values:
    supplying the laser current $I_f$ to the injection-seeded laser; and
    sampling a corresponding BFM current $I_{BFM}$ value.
5. The method as claimed in claim 3, further comprising storing the estimated threshold current and slope efficiency in a non-volatile memory.
6. A method of controlling an injection-seeded laser, the method comprising:
    sampling a response of the laser at a plurality of different laser current values;
    estimating a threshold current and a slope efficiency of the sampled response;
    calculating a bias current and a modulation current based on the estimated threshold current and the slope efficiency;
    sampling a temperature indicative of that of the laser;
    computing respective temperature coefficients of the estimated threshold current and slope efficiency; and
    storing the sampled temperature and the temperature coefficients in a non-volatile memory,
    wherein sampling the response of the laser comprises sampling a respective back facet monitoring (BFM) current $I_{BFM}$ at each one of the plurality of laser current $I_f$ values and wherein the plurality of laser current $I_f$ values are predetermined.
7. The method as claimed in claim 3, wherein calculating the bias current and the modulation current comprises:
    sampling a temperature indicative of that of the laser;

retrieving respective calibration values of the threshold current and the slope efficiency from a non-volatile memory;

retrieving respective temperature coefficients of threshold current and slope efficiency from the non-volatile memory;

calculating respective initial values of the bias current and the modulation current based on the sampled temperature, the calibration values of the threshold current and the slope efficiency, and the temperature coefficients.

8. The method as claimed in claim 2, wherein sampling the back facet monitoring (BFM) current $I_{BFM}$ comprises, during run-time of the injection-seeded laser, accumulating a set of corresponding ($I_{BFM}$, $I_f$) value pairs.

9. A method of controlling an injection-seeded laser, the method comprising:

sampling a response of the laser at a plurality of different laser current values;

estimating a threshold current and a slope efficiency of the sampled response;

calculating a bias current and a modulation current based on the estimated threshold current and the slope efficiency, wherein the modulation current is calculated based on the estimated slope efficiency of the sampled response, an estimated back facet monitoring current at a bias point of the laser, and a desired modulation depth; and processing the accumulated set of ($I_{BFM}$, $I_f$) value pairs to eliminate ($I_{BFM}$, $I_f$) value pairs having duplicate values of $I_f$, wherein sampling the response of the laser comprises sampling a respective back facet monitoring (BFM) current $I_{BFM}$ at each one of the plurality of laser current $I_f$ values, and wherein sampling the back facet monitoring (BFM) current $I_{BFM}$ comprises, during runtime of the injection-seeded laser, accumulating a set of corresponding ($I_{BFM}$, $I_f$) value pairs.

10. The method as claimed in claim 8, wherein the set of ($I_{BFM}$, $I_f$) value pairs comprises a predetermined number of ($I_{BFM}$, $I_f$) value pairs.

11. The method as claimed in claim 8, wherein estimating the threshold current and the slope efficiency of the sampled response comprises processing the accumulated set of ($I_{BFM}$, $I_f$) value pairs to compute respective estimates of the threshold current and the slope efficiency.

12. The method as claimed in claim 11, wherein calculating the bias current and the modulation current comprises:

sampling a temperature indicative of that of the laser;

retrieving respective temperature coefficients of threshold current and slope efficiency from the non-volatile memory;

calculating respective updated values of the bias current and the modulation current based on the sampled temperature, the respective computed values of the threshold current and the slope efficiency, and the temperature coefficients.

13. The method as claimed in claim 12, wherein the at least the steps of sampling the temperature and calculating respective updated values of the bias current and the modulation current are repeated at predetermined intervals during a run-time of the laser.

14. The method as claimed in claim 1, wherein the bias current is calculated by multiplying the estimated threshold current by a predetermined threshold multiplying factor.

15. The method as claimed in claim 14, wherein the predetermined threshold multiplying factor is a function of the slope efficiency.

16. A method of controlling an injection-seeded laser, the method comprising:

sampling a response of the laser at a plurality of different laser current values;

estimating a threshold current and a slope efficiency of the sampled response; and calculating a bias current and a modulation current based on the estimated threshold current and the slope efficiency, wherein the bias current is calculated by multiplying the estimated threshold current by a predetermined threshold multiplying factor, and wherein the predetermined threshold multiplying factor is held at a predetermined upper limit for values of normalized slope efficiency below a predetermined threshold value, and is decreased to a predetermined lower limit at values of normalized slope efficiency above the predetermined threshold value.

17. The method as claimed in claim 1, wherein the desired modulation depth is a function of the slope efficiency.

18. The method as claimed in claim 17, wherein the desired modulation depth is held at a predetermined lower limit for values of normalized slope efficiency below a predetermined threshold value, and is increased to a predetermined upper limit at values of normalized slope efficiency above the predetermined threshold value.

19. A computer readable medium comprising computer instructions for controlling a controller unit of an injection seeded laser to execute the method of claim 1.

20. An optical transmitter comprising an injection seeded laser and a controller unit for controlling an output of the injection seeded laser, the controller unit operating under control of software implementing the method of claim 1.

* * * * *